United States Patent
Huang et al.

(10) Patent No.: US 8,878,281 B2
(45) Date of Patent: Nov. 4, 2014

(54) METHODS AND APPARATUS FOR NON-VOLATILE MEMORY CELLS

(75) Inventors: Chung-Jen Huang, Tainan (TW); Hung-Yueh Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/478,406

(22) Filed: May 23, 2012

(65) Prior Publication Data
US 2013/0313626 A1  Nov. 28, 2013

(51) Int. Cl.
*H01L 29/788* (2006.01)

(52) U.S. Cl.
USPC ........... 257/321; 257/315; 257/316; 257/320; 365/148; 365/185

(58) Field of Classification Search
USPC .................................. 257/315–325; 438/264
See application file for complete search history.

(56) References Cited

U.S. PATENT DOCUMENTS

| | | | |
|---|---|---|---|
| 5,494,838 A * | 2/1996 | Chang et al. | 438/264 |
| 5,986,303 A | 11/1999 | Choi et al. | |
| 7,816,723 B2 | 10/2010 | Klinger et al. | |
| 7,829,404 B2 | 11/2010 | Klinger et al. | |
| 7,839,682 B2 | 11/2010 | Tran et al. | |
| 7,851,846 B2 | 12/2010 | Do et al. | |
| 7,868,375 B2 | 1/2011 | Liu et al. | |
| 7,927,994 B1 * | 4/2011 | Liu et al. | 438/594 |
| 2006/0170028 A1 | 8/2006 | Jeon et al. | |
| 2006/0203552 A1 * | 9/2006 | Chen et al. | 365/185.17 |
| 2008/0248620 A1 * | 10/2008 | Liu et al. | 438/257 |
| 2009/0200595 A1 * | 8/2009 | Nagai | 257/316 |

FOREIGN PATENT DOCUMENTS

| | | |
|---|---|---|
| JP | 1092961 A | 7/1997 |
| JP | 2000183186 A | 6/2000 |
| KR | 20060078146 A | 7/2006 |

* cited by examiner

*Primary Examiner* — Matthew W Such
*Assistant Examiner* — Frederick B Hargrove
(74) *Attorney, Agent, or Firm* — Slater and Matsil, L.L.P.

(57) ABSTRACT

Methods and apparatus for non-volatile memory cells. A memory cell includes a floating gate formed over a substrate with a tunneling dielectric over an upper surface of the floating gate and an erase gate over the tunneling dielectric. Sidewall dielectrics enclose the tunneling dielectric. Assist gates and coupling gates are formed on either side of the memory cell and are spaced from the floating gate of the memory cell by the sidewall dielectrics. Methods for forming memory cells include depositing a floating gate over a dielectric layer over a semiconductor substrate, depositing a tunneling dielectric over the floating gate, depositing an erase gate over the tunneling dielectric, patterning the erase gate, tunneling dielectric and floating gate to form memory cells having vertical sides, and depositing sidewall dielectrics on the vertical sides of the memory cells to seal the tunneling dielectrics. Additional steps are performed to complete the cells.

19 Claims, 14 Drawing Sheets

METHODS AND APPARATUS FOR NON-VOLATILE MEMORY CELLS

BACKGROUND

Continuing reduction of the minimum features produced by semiconductor processes and reduction in the size of the resulting devices has enabled continued improvements in speed, performance, density, and cost per unit function of integrated circuits and systems. As semiconductor process nodes continue to shrink, certain process features become difficult to monitor and thus, ensure uniform results. As the feature sizes for certain materials dictate device performance, the inability to observe or verify the thickness of layers, for example, at advanced semiconductor process nodes, creates problems in manufacturing uniformly performing devices.

In the use of non-volatile memory cells such as FLASH memory cells, a floating gate is provided that is surrounded by electrical insulator materials such as dielectric materials. Using hot electron injection or quantum tunneling, electrons may be stored on the floating gate. By using the floating gate as part of a MOS transistor in a memory cell, the cell may be programmed by adjusting the threshold voltage (Vt). When a read potential is provided to the floating gate by capacitively coupling the floating gate to an adjacent gate such as an erase gate or control gate, the stored data will either cause the cell to conduct and couple a bit line to a source connection, or not conduct, so that the memory cell can store a "1" or a "0". To erase a programmed memory cell with a floating gate, a potential across a dielectric material such as a nitride or oxide is used to remove electrons from a floating gate to another gate conductor called an "erase gate" in an "ERASE" operation. The dielectric thicknesses between, for example the erase gate and the floating gate can therefore be critical to overall cell performance, affecting erase times (erase speed) and erase efficiency. In a typical "split gate" arrangement for FLASH cells, an erase gate electrode is formed between two adjacent memory cells each having floating gate electrodes that are surrounded by dielectric material. During an erase operation, electrons tunnel through a sidewall dielectric to the erase gate. However, this sidewall dielectric is formed in a manner that makes monitoring the thickness and uniformity of the dielectric during semiconductor processing impractical or impossible. Further, because this sidewall dielectric between the erase gate and the floating gate is exposed to various subsequent process steps after the dielectric formation, including etching and patterning steps for example, additional changes in the dielectric thickness after it is initially deposited can occur, and the changes to thickness in this dielectric affect cell erase operation and device speed.

As memory becomes increasingly important for portable devices, such as mobile phones, tablet computers, laptop computers, e-readers, and other battery operated devices, the use of non-volatile memory is increasingly prevalent. One important feature of non-volatile memory for battery powered devices is that the non-volatile memory cell retains its data even when the power in a device battery is lost. The data can be retained almost indefinitely as the floating gate that stores the charge corresponding to the stored data is electrically isolated. These non-volatile memory devices are continuously becoming larger, and lower in cost, and are currently displacing some, or all, of the data and program storage previously allocated to both dynamic RAM devices (DRAMs) and also hard disk drives (HDDs), for example, thus the need for efficiently manufactured, robust and cost effective non-volatile memory cells is increasing.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods for forming a non-volatile memory cell with a floating gate, a tunneling dielectric disposed over a top surface of the floating gate, and an erase gate disposed over the tunneling dielectric. The tunneling dielectric is formed as a horizontal layer over the floating gate electrode in a manner that permits monitoring of the dielectric thickness so that the thickness can be controlled. Further, additional dielectric layers are formed surrounding the floating gate, tunneling dielectric, and erase gate electrode, so that the tunneling dielectric is sealed or isolated from many subsequent processing steps such as etch and patterning steps. Because the tunneling dielectric is protected during later process steps, the thickness obtained during the initial formation steps is maintained; and can be easily monitored and controlled.

Figure 1:
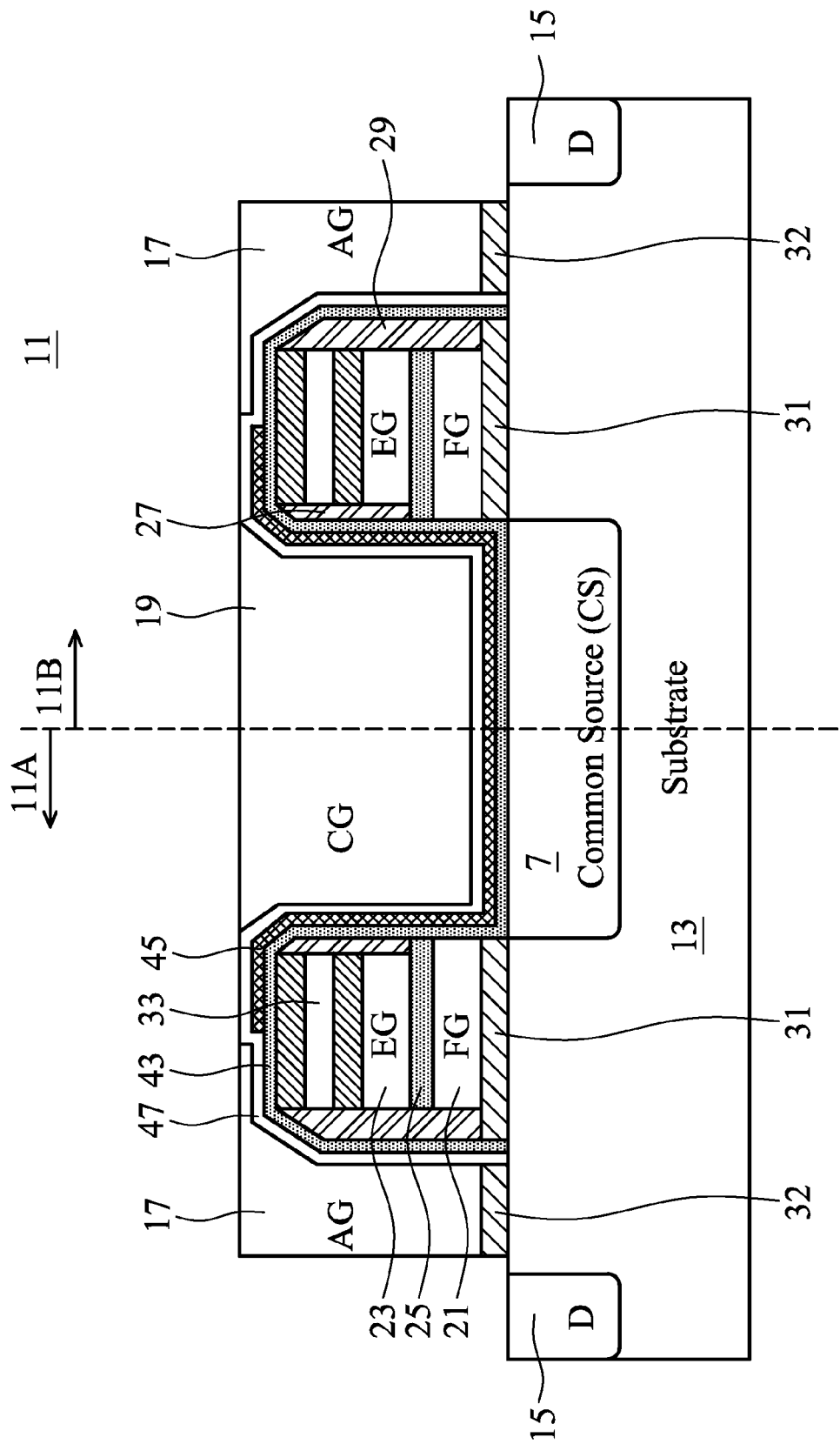
FIG. 1 depicts a cross-sectional view of an embodiment structure.

FIG. 1 depicts in a cross sectional view an example non-volatile memory cell embodiment 11. Two symmetric non-volatile cells 11A and 11B are shown on either side of a common source region 7 which is formed in a diffusion region in substrate 13. Substrate 13 is a semiconductor substrate and may be, for example, silicon, germanium, germanium arsenide or other semiconductor materials. The substrate 13 may be part of a semiconductor die or wafer. The substrate 13 may also be an epitaxial layer such as a silicon on insulator or "SOI" layer over an insulator or other substrate.

Each of the memory cells 11A and 11B is adjacent a drain diffusion region 15, which as is explained below, may be coupled to a bit line conductor. Although only two memory cells are shown in this cross sectional view, many thousands or millions of memory cells are provided in a practical device. Further, as is known, density of memory cells may be increased by sharing erase gates, the common source, the drain lines coupled to bit lines, and other control lines among many cells. Different architectures may be used such as NOR and NAND FLASH arrays, and depending on the particular architecture chosen, the individual cells may be erased in large blocks, or smaller groups; with a trade-off between cell density and accessibility.

Each memory cell 11A and 11B is also adjacent to an assist gate 17. The assist gates will be coupled to "word lines" or row lines from decoding circuitry. The side of the memory cells that is adjacent the assist gates 17, that is, the outside sidewalls, are the word line sides of the memory cells.

Each of the memory cells 11A and 11B seen in the cross section 11A and 11B has a floating gate 21 surrounded by dielectric layers. An erase gate 23 is formed over the floating gate in each cell, and insulated from the floating gate by a tunneling dielectric 25. The erase gate may be co-extensive with the floating gate, or as is described below, can cover a substantial portion of, but not necessarily the entire floating gate. A nitride-oxide-nitride ("NON") hard-mask material 33 overlies each of the erase gates, and results from processing steps using photolithography and etch as is described below, other hardmask materials could also be used. A coupling gate 19 overlies the dielectric layers 43, 45, 47 in the common source region between the two cells 11A and 11B. The coupling gate is spaced from the erase gate by sidewall dielectric layers such as 27, which are formed of silicon nitrides, silicon oxides, silicon oxynitrides, or other dielectric materials. A sidewall dielectric layer 29 formed on the outside portions of each of the memory cells 11A and 11B spaces the floating gate 21 of each cell from an assist gate 17 which is formed over the substrate 13 between the drain 15 and the floating gate 21 for each of the memory cells. The assist gate will be coupled to a "word line" and in an array of memory cells dielectric layer 32, the word lines or assist gates may be shared by many cells along a row or column in an array.

In FIG. 1, the tunneling dielectric 25 between the erase gate 23 and the floating gate 21 is surrounded by the floating gate, and the erase gate, and sidewall dielectric material such as 27 or a portion of 43. Once the sidewall dielectrics have been formed, the tunneling dielectric is protected and not exposed further. The thickness and uniformity of the tunneling dielectric layer 25 for the memory cells determines erase speed and erase potentials and thus, is a critical aspect of the memory cells. The methods and apparatus embodiments described herein provide memory cells with tunneling dielectric having thicknesses that are easily monitored during processing, and which provide very uniform results across the devices, resulting in improved performance as is further described below.

FIGS. 2-6 depict a series of processing steps cross sectional views, showing the results of the steps used to form the embodiment memory cells such as depicted in FIG. 1.

Figure 2:
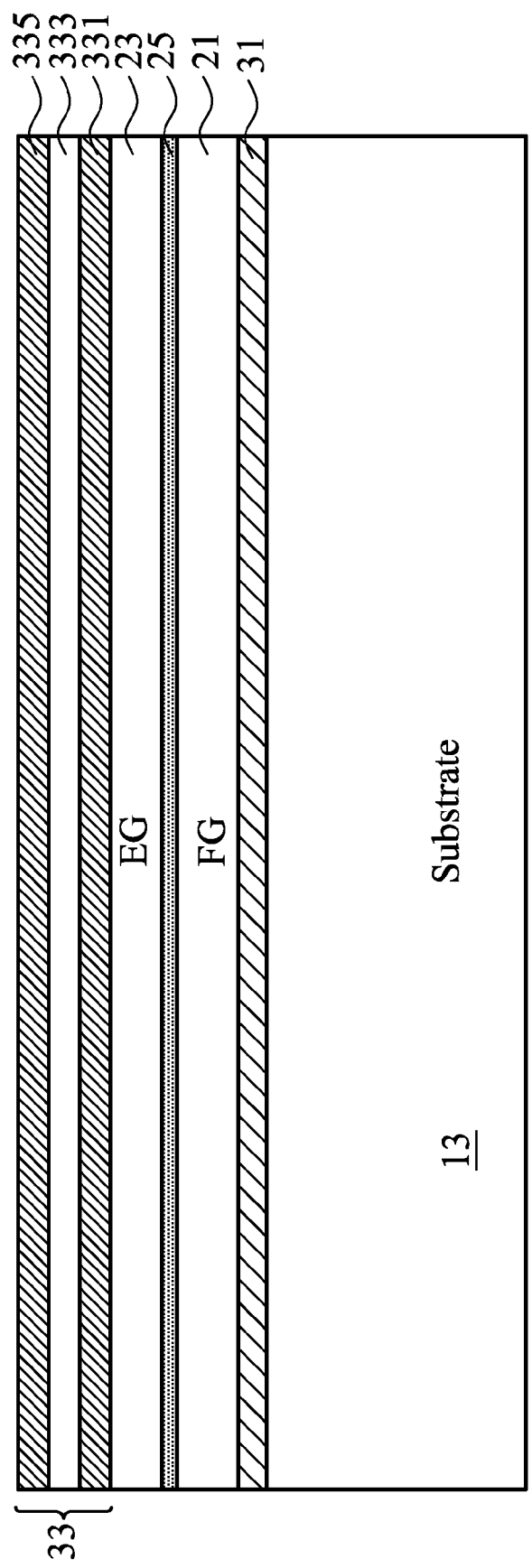
FIG. 2 depicts in a cross-sectional view an embodiment structure at an intermediate process step.

FIG. 2 depicts in a cross section a portion of a memory device 11 including substrate 13, and formed over the substrate 13, dielectric layer 31, floating gate layer 21, tunneling dielectric layer 25, erase gate layer 23, and a hardmask which may include, for example, multiple layers such as a nitride layer 331, an oxide layer 333, and a second nitride layer 335, to form a "N-O-N" mask layer. Other hardmask materials could be used.

Dielectric layer 31 may be, for example, an oxide such as a silicon dioxide. In a device that incorporates a non-volatile memory array in one portion with planar logic devices in another portion of a substrate, this layer may be formed in an oxidation step that includes logic gate oxide formation. This layer may alternatively be formed of a nitride or other dielectric material.

Floating gate layer 21 is formed of a conductor. Typically a polysilicon deposition is performed and the polysilicon is doped to be conductive. However, the embodiments are not limited to polysilicon, and other floating gate materials may also be used.

Tunneling dielectric layer 25 is then formed over the floating gate by deposition. This dielectric layer is very thin to allow Fowler-Nordheim tunneling to be used during erase cycles to erase the memory cells as is described further below. The erase gates in the embodiments are disposed over all, or a, portion of, the floating gate, and over the tunneling dielectric. This is in sharp contrast to prior non-volatile memory cells which often position the erase gate in a portion between memory cells. In this "split gate" structure, an erase dielectric is often formed as a sidewall dielectric that spaces the erase gate from the floating gate. Sidewall dielectric thicknesses are particularly difficult to monitor and control during processing, and in addition the sidewall dielectrics are subjected to etch and patterning processes that may result in a non-uniform thickness. In the embodiments of this application, in contrast to the prior approaches, the tunneling dielectric is a horizontal layer formed between the upper surface of the floating gate, and the bottom surface of the erase gate, and the tunneling dielectric thickness may be monitored during processing, further the uniformity of the thickness is not affected by subsequent processes. In situ process monitoring may be used to determine the thickness of the tunneling dielectric during formation, or it may be confirmed after formation, and the thickness will remain relatively uniform during subsequent processes, unlike a sidewall dielectric.

In illustrative examples, when the device processing was done in an advanced semiconductor process node such as 90 nanometers, or lower, including 65 nanometer and 45 nanometer process nodes, the tunneling dielectric 25 was deposited as an oxide film to a thickness between 80 and 120 Angstroms thick. In further advanced process nodes, embodiments may include tunneling dielectric of somewhat thinner layers of oxide. The floating gate and erase gates used in certain examples in these same process nodes were polysilicon.

Figure 3:
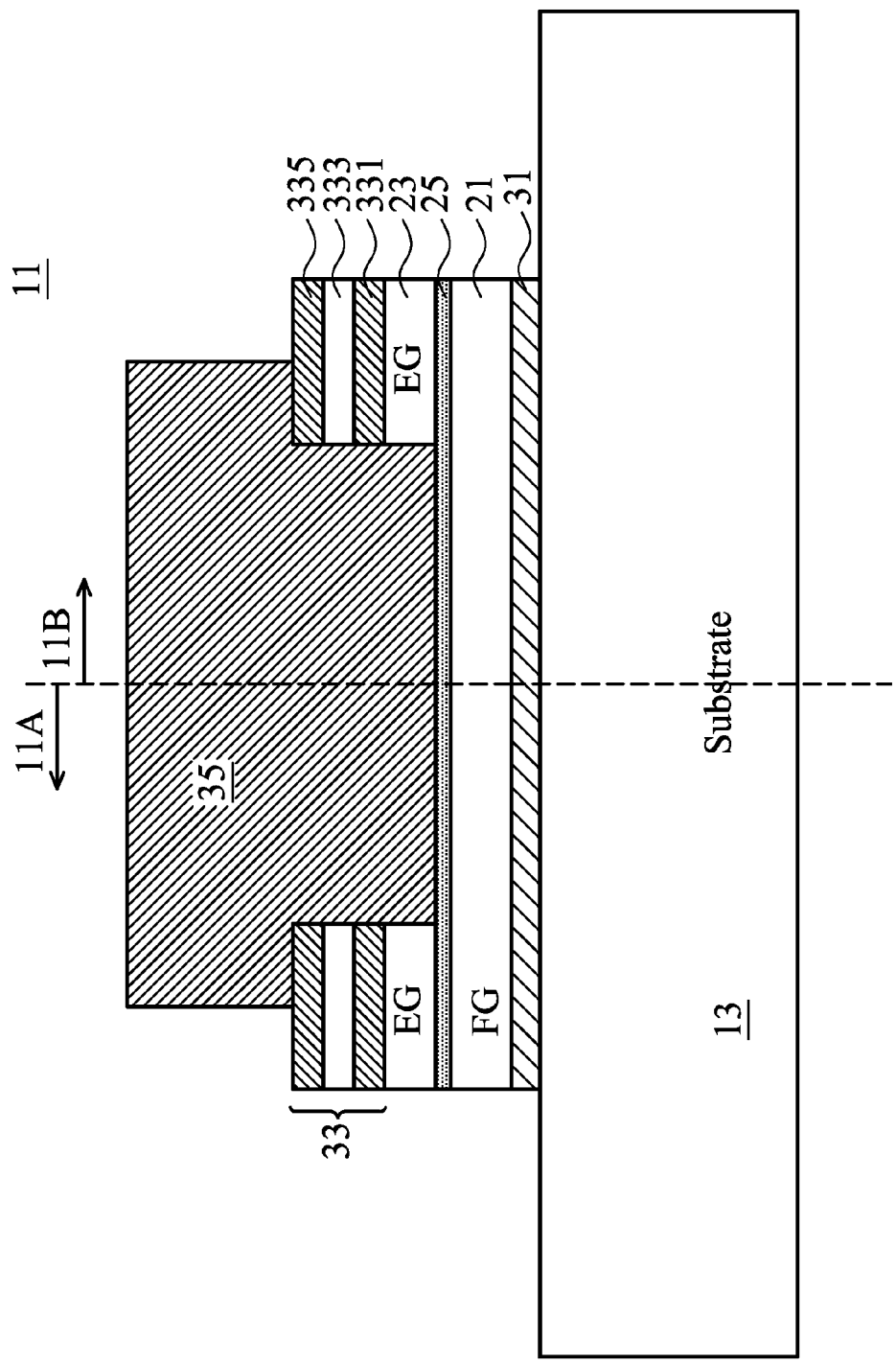
FIG. 3 depicts in a cross-sectional view the structure of FIG. 2 following additional processing.

FIG. 3 depicts the structure 11 in cross section from FIG. 2, following additional processing steps. To transition from the cross section of FIG. 2 to that of FIG. 3, several processing steps were performed. The erase gate layer 23 was patterned with the hardmask layer 33 using photolithography and etch processes to form, in FIG. 3, two memory cells 11A and 11B.

A photoresist 35 is formed over a portion of two memory cells 11A and 11B. The floating gate material 21 and the dielectric layer 31 was etched using the hardmask 33 and the PR 35 to define the outer or word line side sidewalls for each of the two memory cells 11A and 11B. A memory cell well implant (not shown) was performed using the mask 35.

Figure 4:
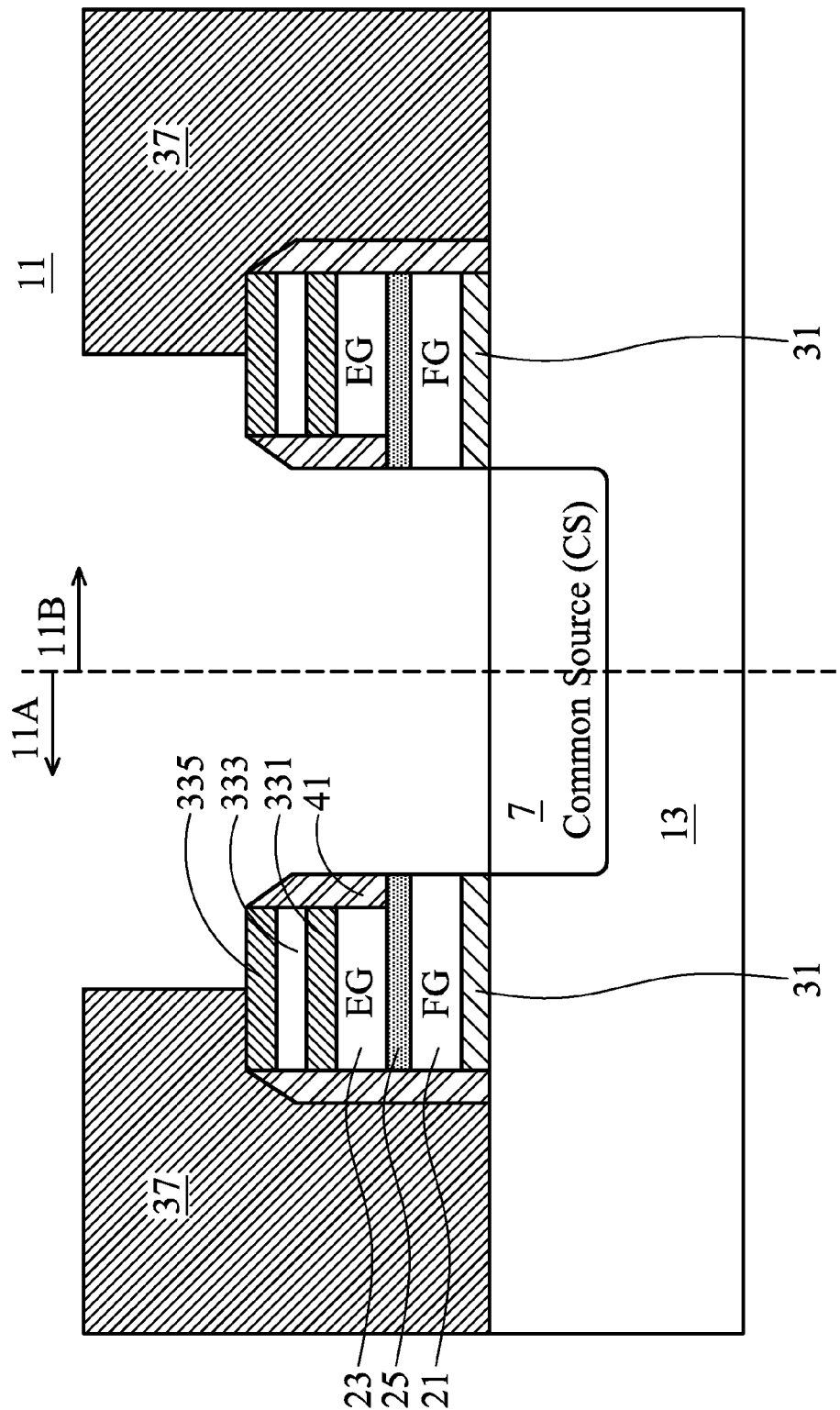
FIG. 4 depicts in a cross-sectional view the structure of FIG. 3 following additional processing.

FIG. 4 depicts in a cross sectional view the embodiment structure 11 of FIG. 3 following additional processing steps. To transition from FIG. 3 to the structure shown in FIG. 4, a sidewall material deposition was performed over the substrate. In an embodiment, for example, the sidewall material 41 may be formed of a nitride material. Alternatives include oxides and oxynitrides, for example. The sidewall material 41 was deposited over the substrate and then etched leaving it only on the vertical sidewalls of the erase gate, hardmask and floating gate. A photoresist is formed such as PR 37 as shown in FIG. 4 to expose an area above the common source area. A second photo and etch process was performed on the floating gate 21 to remove the portions between the two memory cells 11A and 11B and expose the common source area. The second floating gate etch defines the inner sidewalls or "source side" sidewalls of the floating gate 21 of each of the cells 11A and 11B. The common source 7 was then implanted using an ion implantation step. For example, if the substrate 13 is a P type silicon substrate, an N-type common source region is defined. An anneal process may be used to diffuse the ions following the implant, to further define the common source region 7 in the substrate. The common source region 7 is shown adjacent to two memory cells in this cross sectional view, however in practice the common source region extends into the page and may be used by additional rows of paired memory cells not seen in this cross section.

As seen in FIG. 4, the process steps for the etch of the floating gate source side sidewalls are such that, after the floating gate is defined, the side portion of the floating gate 21 on the source side extends farther towards the source region than the side of the erase gate 23 lying above it, so that the erase gate 23 is not completely covering the floating gate. Other alternatives are also possible and form additional embodiments, such as an erase gate that covers more, or less, of the surface area of the floating gate than shown in FIG. 4. The erase gate should cover a substantial portion of the floating gate area, to operate efficiently, but need not be the same size as the floating gate, or cover the entire floating gate, although these are also alternatives that are embodiments.

Figure 5:
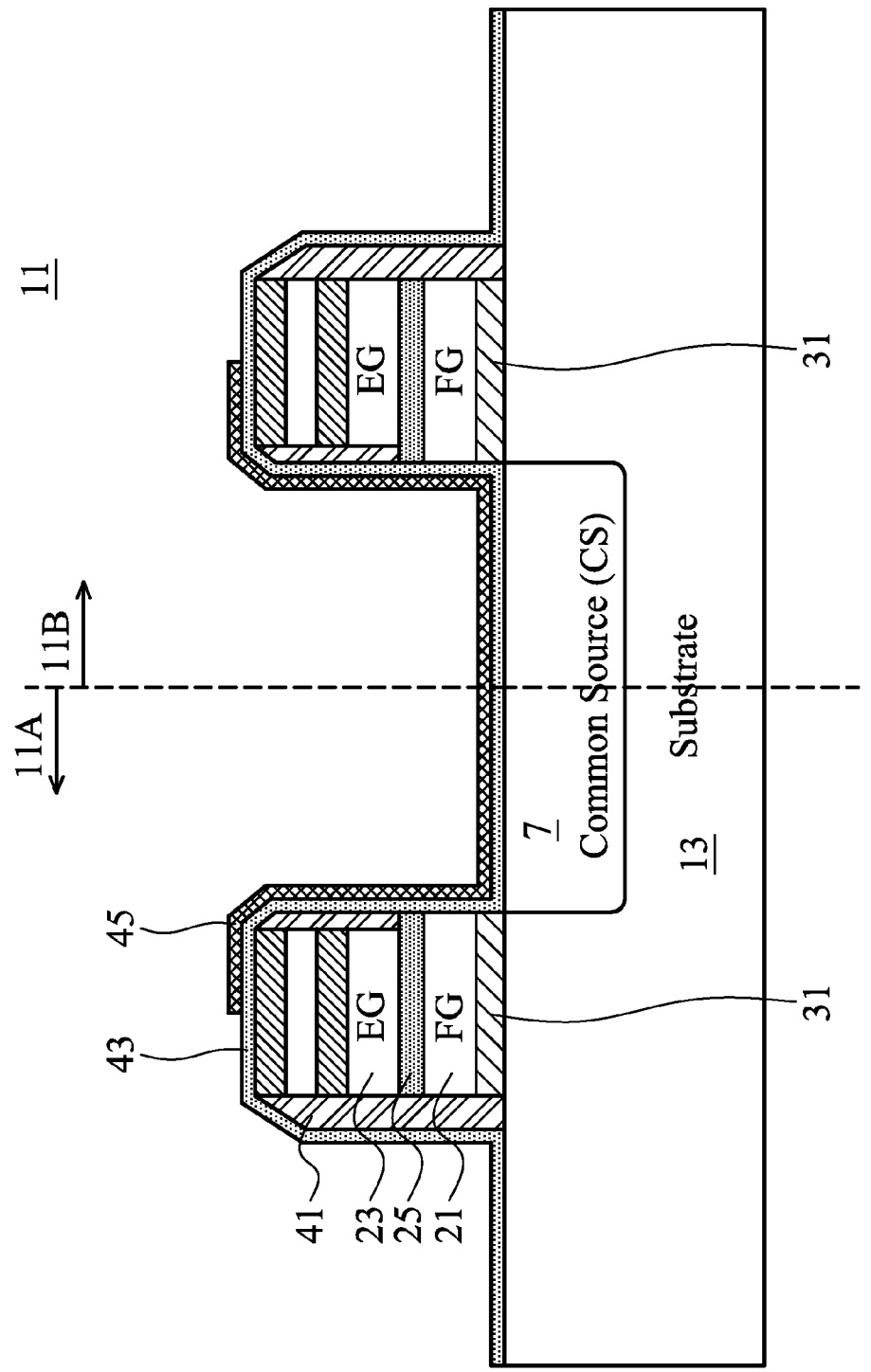
FIG. 5 depicts in a cross-sectional view the structure of FIG. 4 following additional processing.

FIG. 5 depicts the structure 11 in cross section following additional processing steps. To transition to the structure of FIG. 5, the memory cells 11A and 11B are shown after a deposition of an oxide layer 43 and a nitride layer 45, followed by a photolithography process and subsequent etch of the nitride layer 45 to remove it from the word line side sidewalls of each the memory cells 11A and 11B, while leaving it over the common source 7. The tunneling dielectric 25 is sealed following the deposition of the layer 43, so that the tunneling dielectric 25 is then protected from any subsequent etch and patterning processes and is sealed by the oxide 43, the nitride 41, the floating gate 21 and the erase gate 23. The floating gate 21 is also electrically isolated from the substrate by dielectric 31, from the erase gate by the tunneling dielectric 25, and on each side by the nitride layer 41 on the outermost or drain side and the oxide 43 on the source side of the memory cells.

Figure 6:
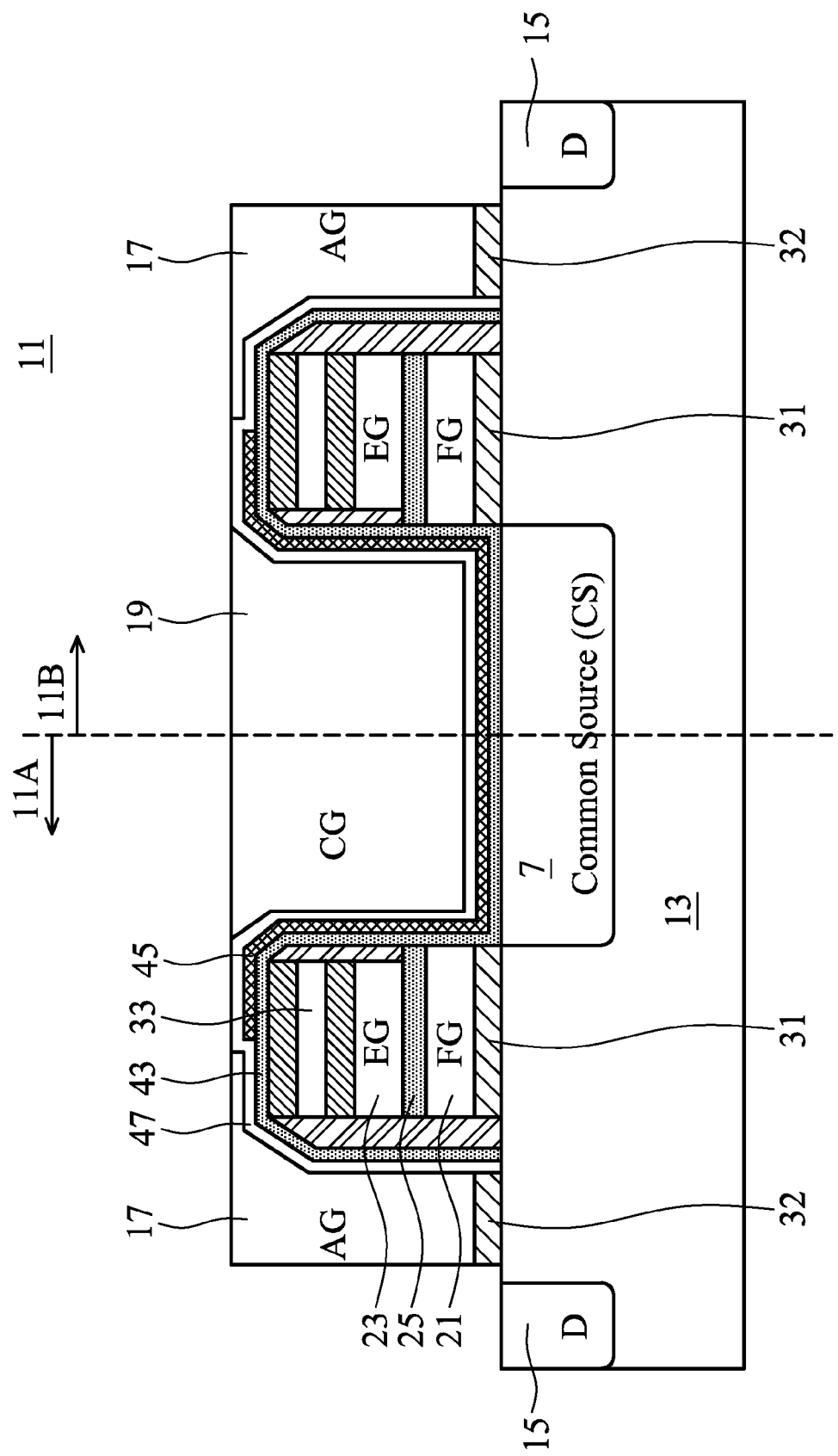
FIG. 6 depicts in a cross-sectional view the structure of FIG. 5 following additional processing.

FIG. 6 depicts in a cross section the structure 11 following additional processing and is essentially the same view as that of FIG. 1, with some additional features numbered. In transitioning from the cross section of FIG. 5 to that of FIG. 6, additional process steps are performed to complete the memory cells. In FIG. 6, a final oxide layer 47 is shown deposited over the nitride 45 and the oxide 43. This oxide forms the final portion of an "ONO" layer that is formed over the source side sidewalls of the memory cells 11A and 11B. In a process where, in addition to the memory cells of structure 11, multiple gate logic devices are formed somewhere else on the substrate, this oxide may be formed with the multiple gate oxide for the multiple gate logic devices. Otherwise, another oxide deposition is performed to form layer 47 which is the "top oxide" layer for the ONO dielectric of layers 43, 45 and 47 in FIG. 6. The coupling gate 19, labeled CG, and assist gates 17, labeled AG, are gate electrodes which may be formed at the same time as the gate electrodes for logic devices formed elsewhere in the substrate. The dielectric layer 32 beneath the assist gates 17 may similarly be formed with the logic gate oxide, or, using a separate process step.

In embodiments using present process nodes, the thicknesses for the ONO layers may be between 30-50 Angstroms, for the bottom oxide, 50-90 Angstroms, for the nitride layer, and 30-50 Angstroms, for the top oxide layer.

In examples, the assist gate 17 and coupling gate 19 are formed of polysilicon. In future advanced process nodes, an alternative embodiment may use metal gate materials for these conductive gates—that is, the same conductive material as used for the logic gates formed in the process. After the polysilicon deposition, the memory cells in structure 11 may be planarized by, for example, a chemical mechanical polish ("CMP") process, an etch process, or a combination.

Following the gate electrode deposition, the assist gates 17 and the dielectric layers 32 are patterned using yet another photolithographic process and etch. The etch opens the substrate 13 for the drain implants to form the drain regions 15, these are then available for use in coupling the bit lines to the memory cells. The bit lines will carry data into and from the memory cells during programming and read cycles as is described below.

In operation, the memory cells may be used as non-volatile cells in NAND or NOR arrangements, for example, with a hot electron injection process from the channel region beneath the floating gate. In an erase mode, the erase gate may have a high potential placed on it and remove any electrons that are stored on the floating gate. For FLASH arrays, many cells may be erased simultaneously to provide a faster erase cycle. In a read mode, the assist gates, which are coupled to word lines from memory decoding logic, may form a channel in the substrate and thus couple the drain regions, which form the bit lines, to the channel region in the substrate beneath the memory cells. If the cell is programmed to a "1", it has a high voltage threshold Vt and it does not couple the bit line to the common source region, which is coupled to a column select line; however if memory cell is not programmed or programmed to a "0" state, it has a lower threshold voltage and turns on, and the bit line is coupled by the channel of the MOS transistor now turned on to conductive mode, and coupled to the common source region, which is at ground during read cycles. In this way, the bit line may be pulled "low" or to a logic "0" when the cell is at a "0" state. Sense amps may then be used to recover the data from the bit lines, which are coupled to or includes the drain regions 15.

Table 1 depicts the voltages that may be applied to the various electrodes during the read, program, and erase operations for the memory cells in some embodiments, although other variations are possible.

TABLE 1

| CM | BL | WL | SL | EG | CG |
|---|---|---|---|---|---|
| Read | 0.5~2 V | 1.0~3 V | GND | 0~5 V | 0~5 V |
| PGM | 0(0~0.9 V) 1(1.2~4 V) | 0.5~1.5 V | 4~6 V | 3~6 V | 4~12 V |
| Erase | GND | GND | GND | 8~14 V | GND |

In Table 1, The bit line or "BL" voltage is coupled to the drain regions, the word line or "WL" voltage is coupled to the assist gate regions, the select line or "SL" is coupled to the common source regions, the erase gate or EG voltage is placed on the erase gates, and the coupling gate or CG receives the potentials shown.

During an erase, the erase gate has a very high potential on it, which draws any stored electrons off the floating gate and away from the cells. As is known, in a FLASH non-volatile memory, many cells forming a "block" which may be quite large are erased simultaneously. This saves decoding and wiring space needed to individually access cells or to access bytes or nibbles, and shortens the time needed for erase cycles. However, the cells must then be programmed in block fashion as well. For many applications this is appropriate, and the FLASH NOR memory is very common. Other arrangements such as NAND memory may also use the cells, with higher densities and more wiring needed.

During a program mode, the bit line carries a voltage corresponding to a logic "0" or "1". The assist gate will receive a voltage that turns on a portion of the channel region underlying the assist gate to aid electrons in flowing through the channel. The select line couples a higher voltage to the common source region. The erase gate and coupling gate are both provided with positive potentials, so that the memory cell forms a channel and turns "on". As electrons flow through the channel, some may be drawn onto the floating gate by hot electron injection and stored there. Depending on the bit line voltage during the program mode, the floating gate may be programmed to be a "0", or lower threshold voltage, or a "1", or higher voltage, as shown in the PGM row for the bit line BL in Table 1.

During a read mode, the bit lines may be initially placed at a nominal or precharged potential. The assist gates of the memory cells are coupled to a word line by address decoding circuitry, and an active word line selects a row or group of memory cells for the read operation. A select line couples a ground voltage to the common source region for the selected cells. Depending on whether the floating gate of the memory cells has been programmed, the cell will turn on as a MOS transistor, forming a channel that couples the bit line to ground, (programmed to a logic "0") or the cell will remain off (if programmed to logic "1") and in that case, not couple the bit line to ground. The bit line potential can then be sensed to determine which logic state the cell is storing. Differential or single ended sense amps may be used, and these output a full logic voltage to external circuitry.

As shown in Table 1, the memory cells of the embodiments provide a memory cell that has a lower read mode voltage than those of the prior art.

Example cells using the embodiments in present semiconductor processes may be about 0.17 microns squared in area, while in future smaller processing nodes, embodiment cells may be around 0.08 microns squared in area.

Figure 7:
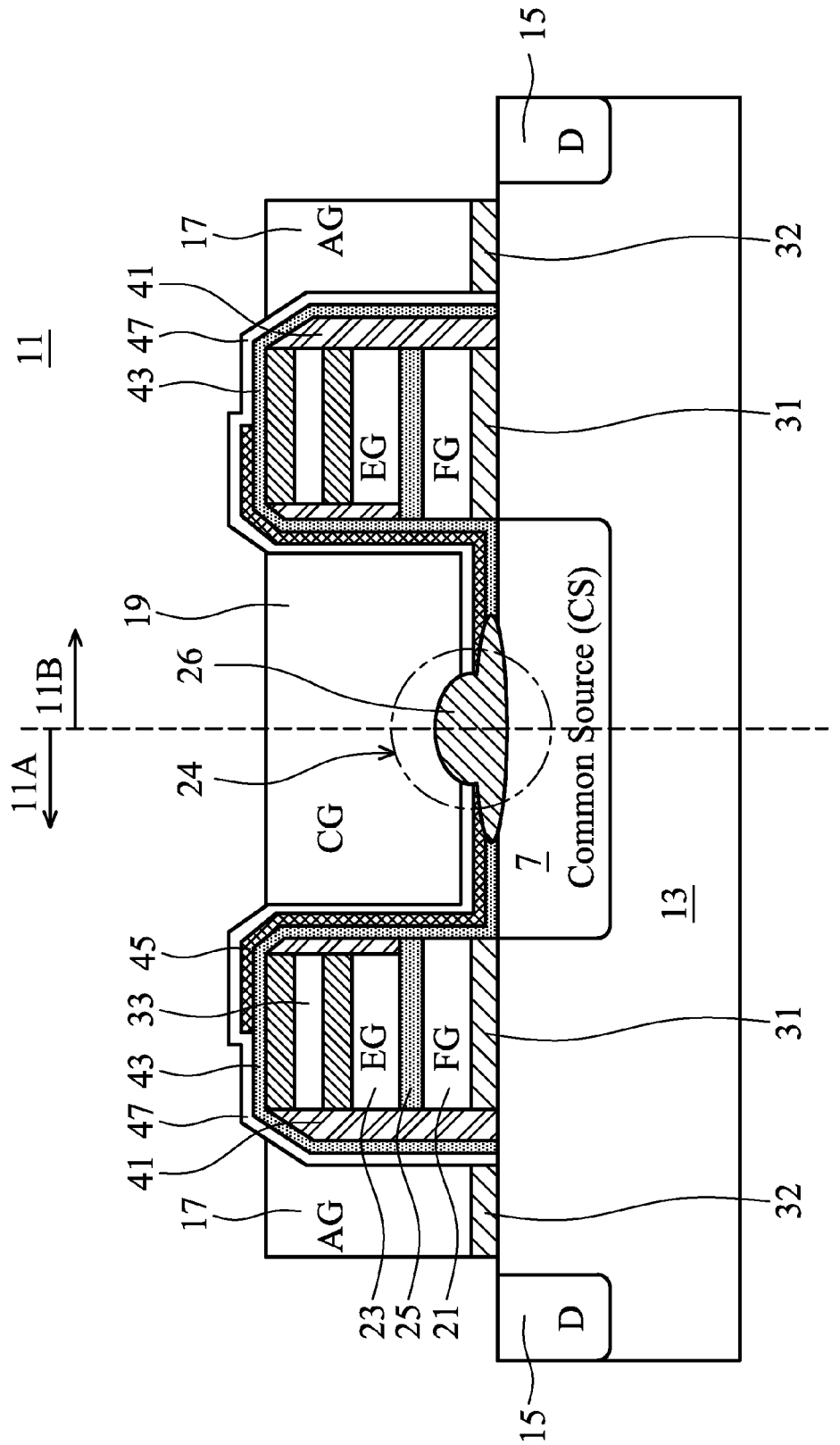
FIG. 7 depicts in a cross sectional view a structure illustrating an alternative embodiment.

FIG. 7 depicts in another cross sectional view 12 a pair of memory cells 12A and 12B that illustrate an alternative embodiment structure. Many features of this embodiment are the same as shown in the above embodiments, for example in FIG. 6, and like numerals are used for those elements which are not again described here.

In FIG. 7, the common source region 7 has an opening in the layer formed from the coupling gate region to the common source region 7. An oxide 26 that has a bulb shape is formed by oxidation of the source region, similar to a LOCOS oxidation. The oxide 26 may be formed simultaneously with oxide 32, for example. This improves the device performance. In one embodiment, this opening is formed by changing the process slightly. After the ON deposition and photolithography as shown in FIG. 5 above, during the etch of the nitride on the word line side sidewalls, an opening is formed in the nitride layer 45 in the central portion of the common source region. When the oxide layer is formed, 47, it fills the opening and forms oxide region 26 in the central portion over the common source region. The processing then continues as before and the assist gates 17 and coupling gate 19 are formed, and the assist gates are patterned to open the drain region diffusion areas for ion implant. The cross section in FIG. 7 illustrates the feature and the area 24 in the dashed circle is the opening in the nitride layer 45 with the oxide 26 extending from the source region 7.

Figure 8:
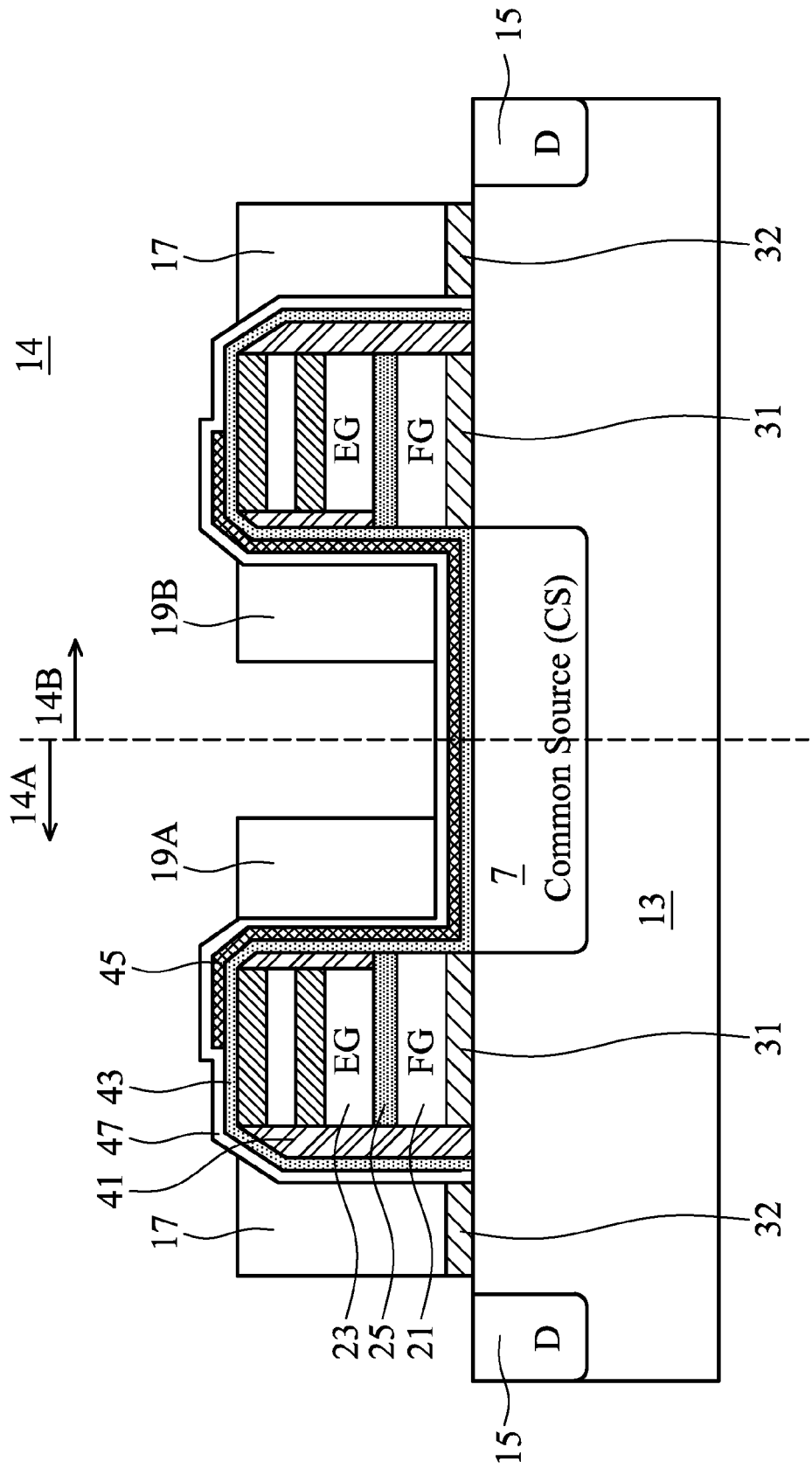
FIG. 8 depicts in a cross sectional another alternative embodiment semiconductor structure.

FIG. 8 depicts in another cross sectional view another alternative embodiment. In FIG. 8, a portion of a memory array 14 is shown with memory cells 14A and 14B in cross section. Again, many elements of this embodiment are the same as for the prior embodiments shown above, and like reference numerals are used for these common elements, which are not described again here.

In this embodiment, during the pattern and etch of the coupling gate 19 and assist gate electrodes 17, an opening is formed in the control gate electrode material and the coupling gate is separated into one portion for the A cell, shown as 19A, and another portion for the B cell, 19B. This feature provides additional flexibility in routing and control for the cells. The remaining elements of the memory cells 19A and 19B are as described above and the operations of the cells are also as described above.

Figure 9:
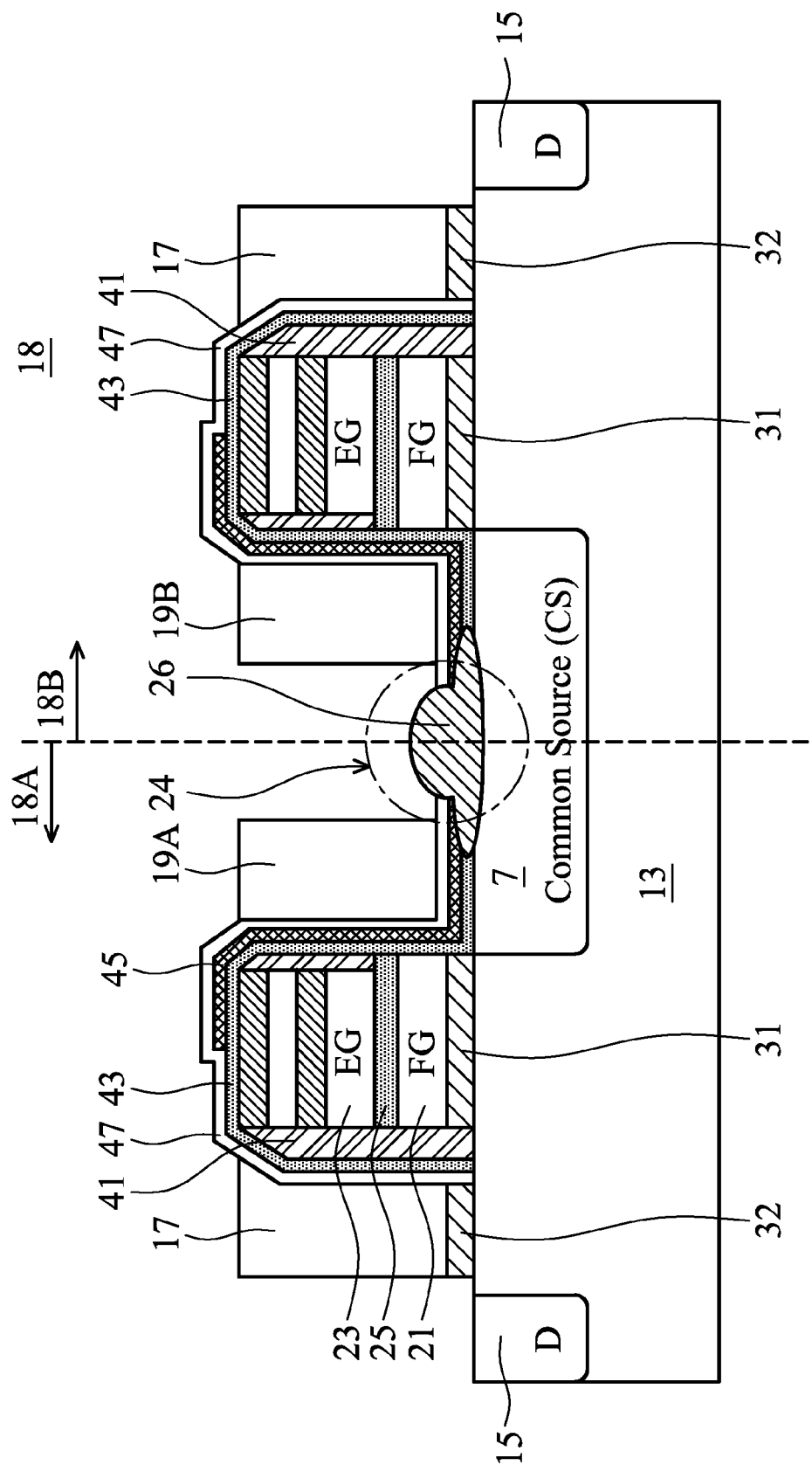
FIG. 9 depicts in a cross-sectional view yet another alternative structure.

FIG. 9 depicts in a cross sectional view yet another embodiment structure 18 of the memory cells. In FIG. 9, the nitride opening in the common source region 24 is combined with the split coupling gate feature, resulting in coupling gates 19A and 19B for memory cells 18A and 18B. The bulb shaped oxide 26 is again formed by oxidation of an open portion of the common source region 7. These additional features further provide additional performance for the memory cells. That is, the embodiments of FIGS. 7 and 8 have added features that may be used independently, or as shown in FIG. 9, these features may be combined together by varying the process steps slightly during the sidewall etch (to remove the nitride 43 in the central portion of the common source region, forming the oxide 26 in the central portion), and, during the gate electrode etch (to split the coupling gate 19 into two portions 19A and 19B. Each of these embodiments also includes the tunneling dielectric 25 and erase gate formed over the floating gate, and the tunneling dielectric is again surrounded by other material and sealed by the sidewall dielectric oxide as described above.

Figure 10:
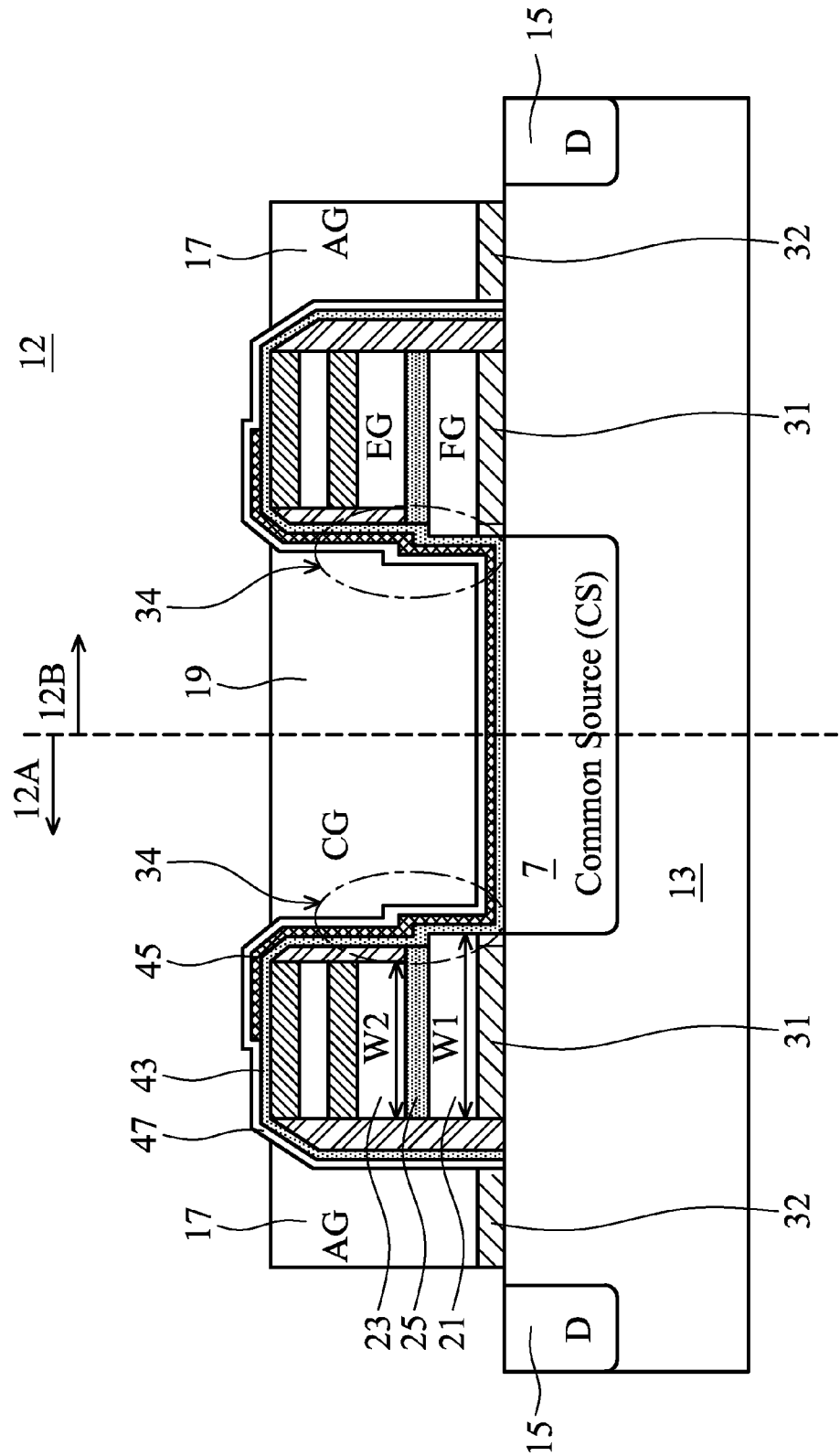
FIG. 10 depicts in a cross-sectional view the another embodiment structure.

FIG. 10 illustrates in a cross sectional view another embodiment structure 12 that is a portion of a memory array. In FIG. 10, a portion of a memory array is shown having memory cells 12A and 12B which are identical memory cells that are symmetrically formed sharing a common source region 7, similar to the embodiments above. Each memory cell has a floating gate 21 that is a first width W1, and a tunneling dielectric 25 and erase gate 23 formed over the floating gate, the erase gate 23 and the tunneling dielectric 25 each have a second width W2 that is less than the first width. This structure is formed so that a portion of floating gate 21 is not covered by the erase gate 23 and dielectric 25, forming a shoulder on the source side end of the floating gate 21, shown in regions 34 for each cell. The coupling gate 19 then is formed over the dielectric layers of ONO, layers 43, 45 and 47, as before and adjacent the source side sidewalls of the floating gate 21. Now the coupling gate 19 also has a portion extending horizontally over the shoulder portion of the floating gate 21, and then the coupling gate 19 is also formed adjacent the source side sidewall dielectric for the erase gate 23 on the source side. Thus the coupling gate 19 covers a portion of the upper surface of the floating gate 21 in each region 34. During a program operation, as shown in Table 1 above, a high potential is placed on the coupling gate. By adding the coupling gate coverage of the "shoulder" portion of the floating gate 21 for each cell, a better coupling ratio is achieved, increasing programming speed (by reducing program time) and efficiency.

Figure 11:
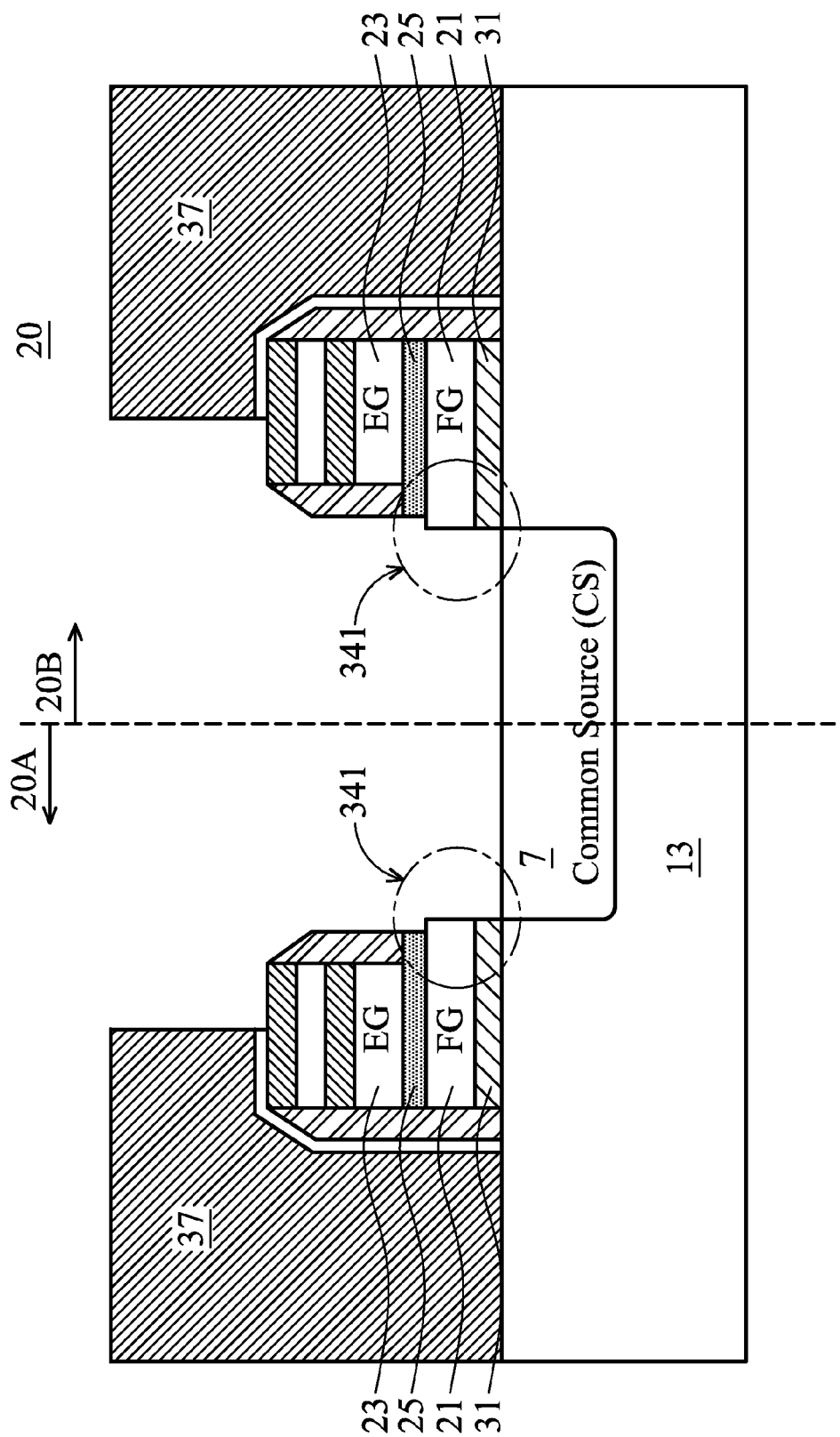
FIG. 11 depicts in a cross-sectional view the structure of FIG. 10 at an intermediate processing step to further illustrate the method embodiments.

The process for forming the embodiment structure 12 shown in FIG. 10 is similar to the process steps described above. However, following the etch of the floating gate word line sidewalls as shown in FIG. 3, above, the process for etching the floating gate on the source side is slightly different. FIG. 11 depicts an example structure 20 having memory cells 20A and 20B following additional processing steps, starting at FIG. 3. The process for forming the sidewall dielectric spacer layer of nitride over the erase gate and tunnel dielectric sidewalls is the same as before. During the second etch of the floating gates 21 on the source side of the memory cells 20A and 20B, the photolithographic pattern and etch is performed so as to leave a shoulder or exposed portion of the floating gates that extends past the sidewall dielectric material, as shown in regions 34 of FIG. 11. To form the memory cell structure of FIG. 10 then, the process continues as before. After the common source implant is performed in region 7, the oxide layer and nitride layer 43 and 45 are deposited, and the nitride layer is patterned and etched on the word line sides of the memory cells. A final oxide layer is deposited over the substrate and the cells, and this completes the layer 47 of the ONO dielectric. Gate electrode material is deposited over the substrate forming the assist gates 17 on the word line side of the memory cells, and the coupling gate 19 is formed over the substrate and covering the shoulder regions of the floating gates 21. The final structure 12 is shown in FIG. 10. With a slight process change, then, another embodiment is provided with additional coupling between the coupling gate and the floating gates of the memory cells.

Figure 12:
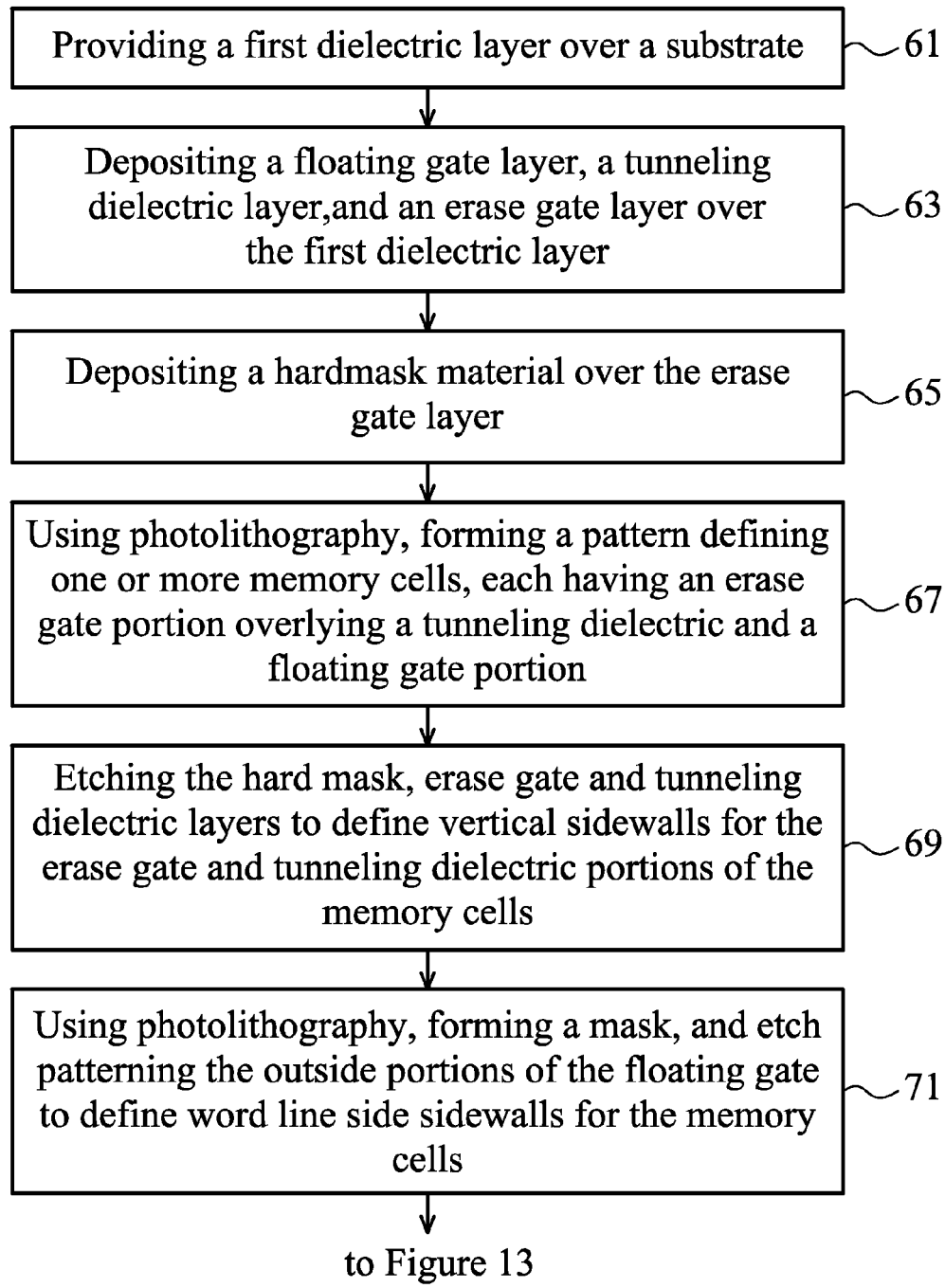
FIG. 12 depicts in a flow diagram the steps of a method embodiment.

FIG. 12 depicts, in a flow diagram form, a portion of the process flow used to form the memory cells on a semiconductor device. In FIG. 12, at step 61 a first dielectric layer, for example oxide layer 31 depicted above, is formed over a semiconductor substrate. At step 63, the floating gate layer such as layer 21, which may be polysilicon, is deposited. The tunneling dielectric layer, which may be a nitride, oxide, or other dielectric as layer 25 depicted in the figures above, is deposited over the floating gate layer. The erase gate layer, which may be another polysilicon layer, is then deposited over the tunneling dielectric.

At step 65, the process continues by depositing the hardmask layer, which may be a NON layer such as layer 33 above, over the erase gate layer. At step 67, a photolithographic step is performed to pattern the layers to form the memory cells each with an erase gate over a tunneling dielectric and that is over the floating gate. At step 69, the hardmask, erase gate, and tunneling dielectric layers are etched to form memory cells that have a word line side, where the assist gates will be formed, and a source line side, with vertical sidewalls on each side.

At step 71, another photolithographic step is used to perform a first pattern and etch on the floating gate layer, to form the word line side sidewalls for the memory cells. The flow diagram then transitions to FIG. 13.

Figure 13:
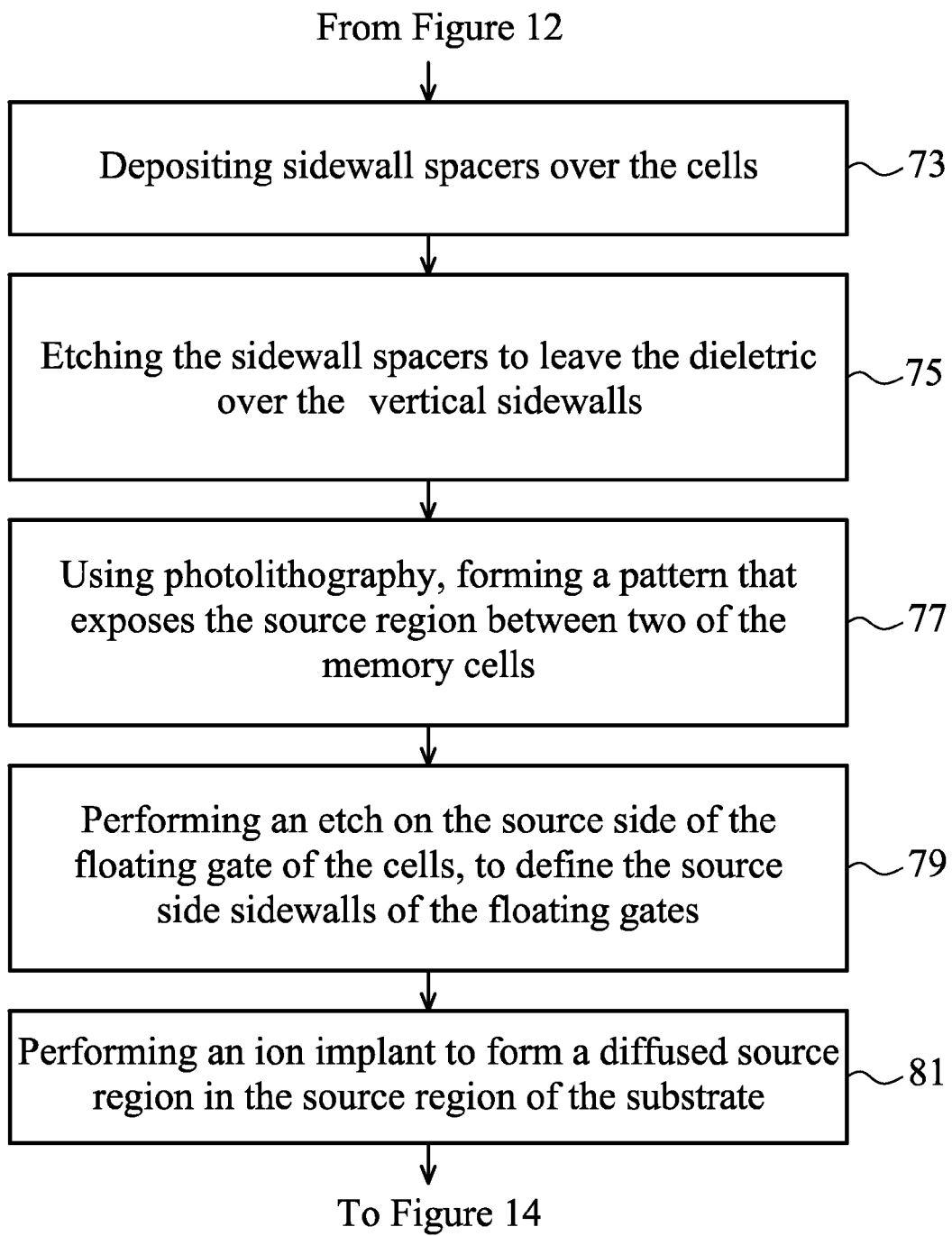
FIG. 13 depicts in a flow diagram the method embodiment of FIG. 12 and continuing steps.

In FIG. 13, the process continues. At step 73 the sidewall spacers, which may be nitride layers such as 29, 27 in FIG. 1 above, are deposited. At step 75 the layers are etched to leave the spacer dielectric only on the sidewalls of the memory cells. At step 77, using another photolithographic process, a common source pattern is provided. Using this pattern, at step 79 an etch is performed on the source side of the floating gates of the memory cells, removing any floating gate material from the central portion between cells in the common source region. At step 81 an ion implant is performed to form a source region diffusion in the common source region. The flow diagram then continues at FIG. 14.

Figure 14:
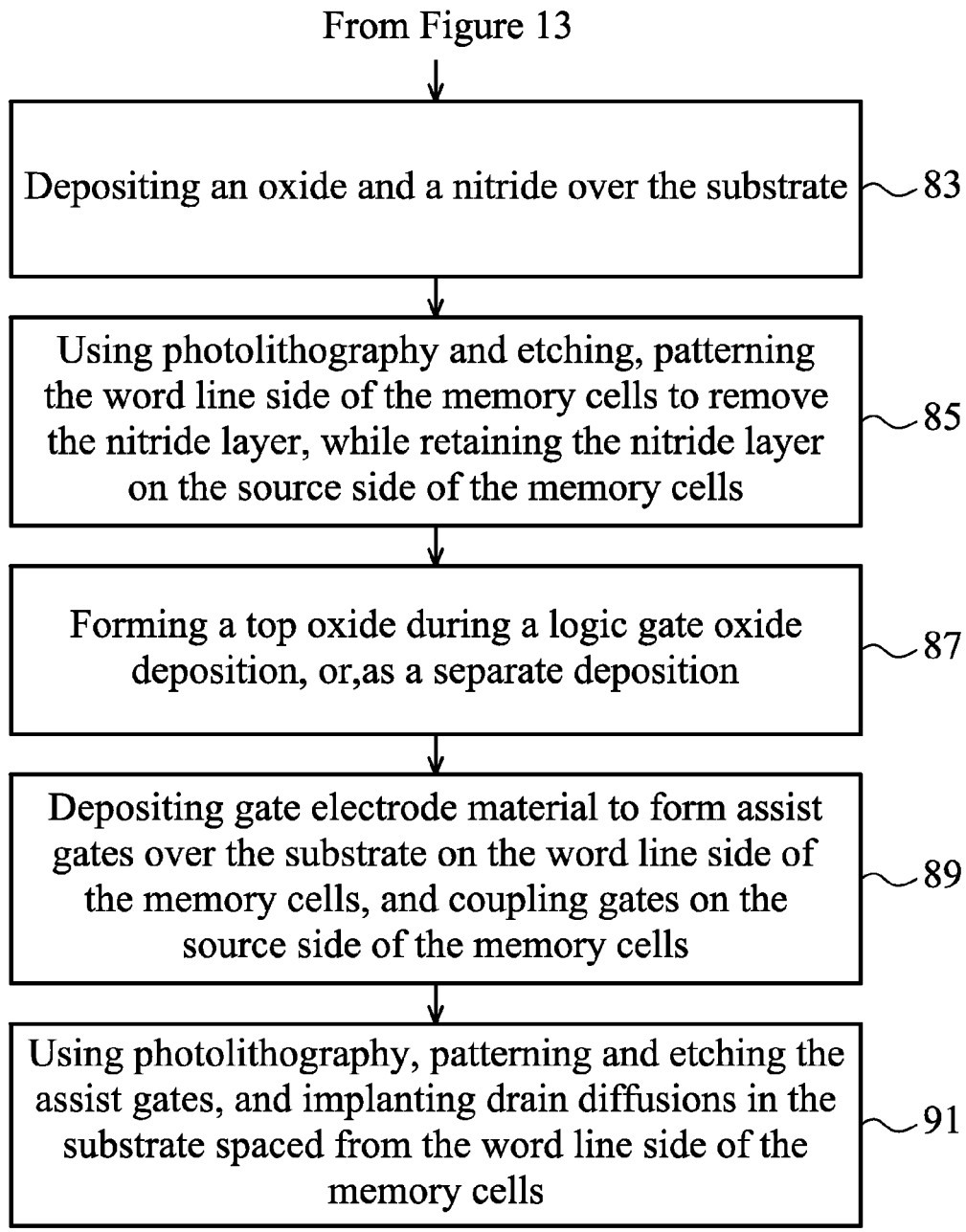
FIG. 14 depicts in a flow diagram the method embodiment of FIG. 13 and continuing steps of the method.

In FIG. 14, the process continues at step 83 by depositing an oxide layer and a nitride layer such as layers 43 and 45, described above, over the memory cells. At step 85, another photolithographic step is performed and the word line side of the memory cells has the nitride layer removed, while the nitride layer is retained over the common source region. In step 87 the top oxide layer is formed to complete an ONO structure such as the layer 47 in the figures, above.

At step 89, the gate electrode material is formed over the assist gate portions and the coupling gate portions as shown above. This electrode material may be deposited simultaneously with a logic gate electrode, if logic devices are also being formed on the substrate, or as a separate process.

At step 91, another photolithographic process may be performed to pattern and etch the assist gate electrodes on the word line side of the memory cells, and open a portion of the substrate adjacent the assist gate electrodes. Finally, the drain region diffusions may be performed to complete the memory cells. In an integrated circuit the drain regions may be coupled as bit lines or as portions of bit lines for the memory cells, while the assist gate electrodes may be coupled to word lines for the memory cells.

The process steps described above are examples and additional process steps may be used or added. Variations may be performed, for example, as described above with respect to FIG. 10, the process at step 79 may form a horizontal shoulder on the floating gate, or not if the embodiment of FIG. 1 is being formed. Also, the nitride layer over the common source region may be opened at step 85, to form the embodiments of FIG. 7, or 9. Further, the coupling gate may be separated into two coupling gates over the common source region, as in FIGS. 9 and 10, at the etch step 91, when the assist gates are patterned. One skilled in the art will certainly recognize other variations that may be made that form additional embodiments of this application, such embodiments are contemplated as additional alternatives and are within the scope of the appended claims.

In an embodiment, a method includes forming a floating gate layer over a semiconductor substrate, forming a tunneling dielectric layer over the floating gate layer, and forming an erase gate layer over the tunneling dielectric layer; patterning a plurality of memory cells by a first photolithographic process, each of the plurality of memory cells having an erase gate over a floating gate separated by the tunneling dielectric, at least two of the plurality of patterned memory cells being spaced apart by a common source region in the semiconductor substrate; performing a second photolithographic process to pattern the floating gate layer, removing a portion of the floating gate layer between at least two of the plurality of memory cells, each of the at least two of the plurality of memory cells having vertical sidewalls; and forming sidewall materials on each of the vertical sides of the floating gate, the tunneling dielectric, and the erase gate of each of the at least two of the plurality of memory cells.

In a further embodiment, the above method includes forming implant regions in the substrate on either side of the at least two of the plurality of memory cells, a first implant region forming a common source in the common source region of the semiconductor substrate on one side of the memory cells, and a second implant region forming a drain region in the semiconductor substrate on an opposite word line side of the memory cells.

In yet another embodiment, in the above method each of the common source regions is disposed between columns of the plurality of memory cells and is shared between at least two columns. In still another embodiment, in the above method, each of the drain regions is shared by at least two memory cells. In a further embodiment, the methods include depositing gate material over the semiconductor substrate and patterning the gate material to form a coupling gate adjacent to a side of the at least two memory cells overlying the common source region of the semiconductor substrate, and forming assist gates for each of the at least two memory cells adjacent the word line side of the at least two memory cells opposite the common source region, the assist gates disposed over the semiconductor substrate between the memory cells and the drain regions in the substrate.

In yet another embodiment, in the above methods the coupling gates fill the space between columns of memory cells. In still a further embodiment, in the above methods, the coupling gates have an opening in a central portion of the common source region between columns of memory cells. In yet another embodiment the method includes forming an opening in a dielectric layer formed over the common source region in the substrate. In yet another embodiment, in the methods above the floating gate for each of the plurality of memory cells has a portion underlying a portion of the coupling gate, and is separated from the coupling gate by an oxide-nitride dielectric.

In one embodiment, a non-volatile memory cell includes a floating gate formed over a semiconductor substrate, and having a dielectric layer between the floating gate and the semiconductor substrate; a tunnel dielectric formed over at least a portion of the floating gate; an erase gate formed over at least a portion of the tunnel; and sidewall dielectric material disposed on a source side sidewall and an opposite word line side sidewall of the erase gate, the floating gate, and the tunnel dielectric, the sidewall dielectric sealing the tunnel dielectric.

In a further embodiment, the memory cell a common source region in the semiconductor substrate adjacent the source side sidewall; and a coupling gate electrode formed adjacent the source side sidewall and over the common source region, and isolated from the floating gate by an oxide-nitride dielectric layer.

In another embodiment, the memory cell includes an opening in a nitride layer that is part of the oxide-nitride dielectric layer. In yet another embodiment, the above described memory cells include a coupling gate electrode that has an opening in a central portion. In still another embodiment, the floating gate has a portion adjacent the source side sidewall that is not covered by the erase gate; and a portion of the coupling gate overlies the portion of the floating gate adjacent the source side sidewall.

In another embodiment a semiconductor device is provided that includes at least two memory cells formed adjacent a common source region in a semiconductor substrate, each of the memory cells further comprising: a floating gate formed over a semiconductor substrate, and having a dielectric layer between the floating gate and the semiconductor substrate; a tunnel dielectric formed over at least a portion of the floating gate; an erase gate formed over at least a portion of the tunnel; and sidewall dielectric material disposed on a source side sidewall of each cell disposed adjacent the common source region and an opposite word line side sidewall of the erase gate, the floating gate, and the tunnel dielectric, the sidewall dielectric material sealing the tunnel dielectric.

In another embodiment, for the memory cells, the tunnel dielectric is an oxide. In a further embodiment, in the semiconductor device the memory cells further include an assist gate electrode formed adjacent the word line side sidewall of each memory cell and over the semiconductor substrate; a common source diffusion formed in the semiconductor substrate in the common source region and between the source side sidewalls of the memory cells; and a coupling gate electrode formed over the semiconductor substrate common source region and adjacent the source side sidewall of each of the at least two memory cells.

In still another embodiment, for each of the memory cells in the semiconductor device, the coupling gate electrode is isolated from the source side sidewalls by an oxide layer and a nitride layer that is also disposed over the common source region of the semiconductor substrate.

In another embodiment, for the memory cells in the semiconductor device, the nitride layer for each of memory cell has an opening in a central portion over the common source region. In still a further embodiment, for each memory cell in the semiconductor device, the coupling gate overlies a portion of the floating gate adjacent the source side sidewall.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile memory cell, comprising:
   a floating gate formed over a semiconductor substrate, and having a dielectric layer between the floating gate and the semiconductor substrate;
   a tunnel dielectric formed over at least a portion of the floating gate;
   an erase gate formed over at least a portion of the tunnel dielectric and in contact with a topmost surface of the tunnel dielectric; and
   sidewall dielectric material having a first portion disposed on a source side sidewall of the erase gate and having a bottommost portion disposed over a portion of the tunnel dielectric and a second portion disposed on an opposite word line side sidewall of the erase gate, the floating gate, and the tunnel dielectric, the sidewall dielectric sealing the tunnel dielectric;

wherein a bottommost surface of the first portion of the sidewall dielectric contacts the topmost surface of the tunnel dielectric.

2. The non-volatile memory cell of claim 1 and further comprising:
   a common source region in the semiconductor substrate adjacent the source side sidewall; and
   a coupling gate electrode formed adjacent the source side sidewall and over the common source region, and isolated from the floating gate by an oxide-nitride dielectric layer.

3. The non-volatile memory cell of claim 2 and further comprising:
   an opening in a nitride layer that is part of the oxide-nitride dielectric layer, the opening disposed over the common source region.

4. The non-volatile memory cell of claim 2, wherein the coupling gate electrode has an opening in a central portion over the common source region and extending from a top surface of the coupling gate electrode through the coupling gate electrode and exposing an underlying structure.

5. The non-volatile memory cell of claim 2, wherein the floating gate has a portion adjacent the source side sidewall that is not covered by the erase gate; and
   a portion of the coupling gate overlies the portion of the floating gate adjacent the source side sidewall that is not covered by the erase gate.

6. A semiconductor device, comprising:
   at least two memory cells formed adjacent a common source region in a semiconductor substrate, each of the memory cells further comprising:
      a floating gate formed over the semiconductor substrate, and having a dielectric layer between the floating gate and the semiconductor substrate;
      a tunnel dielectric formed over at least a portion of the floating gate;
      an erase gate formed over at least a portion of the tunnel dielectric; and
      sidewall dielectric material disposed on a source side sidewall of each cell, disposed adjacent the common source region, and disposed on an opposite word line side sidewall of the erase gate, the floating gate, and the tunnel dielectric, the sidewall dielectric material sealing the tunnel dielectric;
   an oxide layer extending from the word line side sidewall, over the erase gate, over the source side sidewall and between the at least two memory cells; and
   a nitride layer disposed over the oxide layer and extending from a top portion of a first of the at least two memory cells over the source side sidewall and between the at least two memory cells, the nitride layer having an end surface disposed over the oxide layer;
   wherein a first portion of the oxide layer extends past the end surface of the nitride layer.

7. The semiconductor device of claim 6 wherein for the memory cells, the tunnel dielectric is an oxide.

8. The semiconductor device of claim 6, and further comprising:
   an assist gate electrode formed adjacent the word line side sidewall of each memory cell and over the semiconductor substrate;
   a common source diffusion formed in the semiconductor substrate in the common source region and between the source side sidewalls of the memory cells; and
   a coupling gate electrode formed over the semiconductor substrate common source region and adjacent the source side sidewall of each of the at least two memory cells.

9. The semiconductor device of claim 8 wherein for each of the memory cells the coupling gate electrode is isolated from the source side sidewalls by the oxide layer and the nitride.

10. The semiconductor device of claim 9 wherein the nitride layer has an opening in a central portion over the common source region.

11. The semiconductor device of claim 8 wherein for each memory cell, the coupling gate overlies a portion of the floating gate adjacent the source side sidewall.

12. The semiconductor device of claim 11, wherein the floating gate has a portion adjacent the source side sidewall that is not covered by the erase gate.

13. A semiconductor device, comprising:
   a floating gate formed over a semiconductor substrate, and having a dielectric layer between the floating gate and the semiconductor substrate;
   a tunnel dielectric formed over at least a portion of the floating gate;
   an erase gate formed over and in contact with at least a portion of the tunnel dielectric;
   sidewall dielectric material disposed on a source side sidewall of the erase gate and the tunnel dielectric and further disposed on an opposite word line side sidewall of the erase gate, the floating gate, and the tunnel dielectric, the sidewall dielectric sealing the tunnel dielectric, the floating gate and tunnel dielectric extending under the sidewall dielectric material at the source side sidewall, a bottommost surface of the sidewall dielectric material at the source side disposed above the topmost surface of the tunnel dielectric; and
   an oxide-nitride layer having an oxide layer extending from the word line sidewall, over the erase gate, over the source side sidewall and over a region in the semiconductor substrate adjacent the source side sidewall, and further having a nitride layer disposed over the oxide layer and extending from over the erase gate over the source side sidewall and over the region in the semiconductor substrate adjacent the source side sidewall, an oxide layer portion over the word line sidewall without the nitride layer disposed thereon.

14. The semiconductor device of claim 13, further comprising:
   a common source region in the semiconductor substrate adjacent the source side sidewall; and
   a coupling gate formed adjacent the source side sidewall and over the common source region, and isolated from the floating gate by the oxide-nitride layer.

15. The semiconductor device of claim 14, wherein the coupling gate has an opening in a central portion.

16. The semiconductor device of claim 14, further comprising an assist gate formed adjacent the word line side sidewall and over the semiconductor substrate.

17. The semiconductor device of claim 14, further comprising an opening in the nitride layer over the common source region.

18. The semiconductor device of claim 17, wherein the floating gate has a portion adjacent the source side sidewall that is not covered by the erase gate.

19. The semiconductor device of claim 18, wherein a portion of the coupling gate overlies the portion of the floating gate adjacent the source side sidewall that is not covered by the erase gate.

* * * * *